United States Patent
Pinel et al.

(10) Patent No.: US 10,131,299 B2
(45) Date of Patent: Nov. 20, 2018

(54) METHOD FOR CONTROLLING THE VOLTAGE OF AN APPARATUS FITTED IN A MOTOR VEHICLE

(71) Applicants: CONTINENTAL AUTOMOTIVE FRANCE, Toulouse (FR); CONTINENTAL AUTOMOTIVE GmbH, Hannover (DE)

(72) Inventors: Arnaud Pinel, Pins Justaret (FR); Stephane Vitali, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 99 days.

(21) Appl. No.: 15/427,679

(22) Filed: Feb. 8, 2017

(65) Prior Publication Data
US 2017/0225632 A1    Aug. 10, 2017

(30) Foreign Application Priority Data
Feb. 10, 2016  (FR) ..................................... 16 51062

(51) Int. Cl.
*B60R 16/03* (2006.01)
*G01R 19/00* (2006.01)
*G01R 27/26* (2006.01)
*G01R 27/08* (2006.01)

(52) U.S. Cl.
CPC .......... *B60R 16/03* (2013.01); *G01R 19/0046* (2013.01); *G01R 27/08* (2013.01); *G01R 27/2605* (2013.01); *G01R 27/2611* (2013.01)

(58) Field of Classification Search
CPC .... B60R 16/03; G01R 19/0046; G01R 27/08; G01R 27/2605; G01R 27/2611
See application file for complete search history.

(56) References Cited

U.S. PATENT DOCUMENTS

| 5,793,640 A | 8/1998 | Wu et al. |
| 2003/0069722 A1* | 4/2003 | Beattie ................ G06F 17/5036 703/14 |

FOREIGN PATENT DOCUMENTS

| EP | 2 953 246 A2 | 12/2015 |
| EP | 2 966 410 A1 | 1/2016 |
| FR | 2 989 826 A1 | 10/2013 |

OTHER PUBLICATIONS

FR Search Report, dated Oct. 5, 2016, from corresponding FR application.

* cited by examiner

*Primary Examiner* — Daniel Cavallari
(74) *Attorney, Agent, or Firm* — Young & Thompson

(57) ABSTRACT

Disclosed is a method for controlling the voltage of an electrical apparatus of a motor vehicle. The method includes the steps of measuring (E2) the voltage at the terminals of the apparatus and measuring (E3) the strength of the output current of the apparatus, calculating (E4) the values of resistance, inductance and capacitance of the equivalent circuit on the basis of the measured current strength and the measured voltage, comparing (E7, E8, E9) the calculated values of resistance, inductance and capacitance with the values of resistance, inductance and capacitance, respectively, stored in a storage area of the electronic control unit, and initiating (E12) an action if the difference between at least one of the calculated values and the corresponding stored value is above a predetermined threshold.

20 Claims, 3 Drawing Sheets

METHOD FOR CONTROLLING THE VOLTAGE OF AN APPARATUS FITTED IN A MOTOR VEHICLE

FIELD OF THE INVENTION

The invention relates to the field of the voltage control of an apparatus, and more particularly to a device and a method for controlling the voltage of an apparatus fitted in a motor vehicle.

BACKGROUND OF THE INVENTION

The invention may be applied, notably, to the voltage control of an apparatus by pulse width modulated signals, referred to in English as "PWM" or "pulse width modulation" signals.

In a motor vehicle, some apparatuses are controlled in a known way by a control unit, using pulse width modulated voltage control signals (PWM signals). The apparatus may be, for example, an ignition coil, a fuel injector, a fuel pump, an idle valve, or the like.

Pulse width modulation is a commonly used technique for synthesizing continuous signals using circuits with on/off operation, or more generally circuits having discrete states. The general principle is that, by applying a sequence of discrete states during carefully selected time intervals, any intermediate value may be obtained on average over a given time interval.

A voltage-controlled apparatus may be modeled in a known way by an RLC circuit which is electrically connected to the vehicle battery on one hand, and to the ground on the other hand, and which comprises a first branch composed of a capacitor, in parallel with a second branch composed of a resistor and an induction coil connected in series.

The pulse width of the signals for controlling the voltage of the apparatus is predetermined in a known way, for example by the manufacturer, on the basis of this modeling and notably on the basis of the theoretical values of resistance, inductance and capacitance of the model equivalent to the apparatus.

However, it may be the case that this value is unsuitable for controlling the apparatus, for example because the manufacturer's specifications are incorrect in relation to the model, or because the electrical connection between the control unit and the apparatus creates losses which modify the RLC circuit model, or because the resistance, inductance and capacitance values of the model drift over time.

Controlling the voltage by signals of incorrect width may result in an excessively strong or weak input current, which may eventually damage the apparatus, and therefore constitutes a serious drawback.

SUMMARY OF THE INVENTION

The invention is intended to overcome these drawbacks, at least partially, by proposing a simple, reliable and effective solution for controlling an apparatus of a motor vehicle, using pulse width modulated signals.

For this purpose, the invention proposes, in the first place, a method for controlling the voltage of an electrical apparatus of a motor vehicle, using pulse width modulated signals, said electrical apparatus being capable of being electrically modeled in the form of an equivalent RLC circuit comprising a first branch, comprising a capacitor connected in parallel with a second branch, comprising a resistor and an induction coil connected in series, said method, executed by the vehicle's control unit, comprising the steps of:
- controlling the voltage of the apparatus by pulse width modulated signals,
- measuring the voltage at the terminals of the apparatus and the strength of the output current of the apparatus,
- calculating the values of resistance, inductance and capacitance of the equivalent RLC circuit on the basis of the measured current strength and the measured voltage,
- comparing the calculated values of resistance, inductance and capacitance with values of resistance, inductance and capacitance respectively, stored in a storage area of the electronic control unit, and
- initiating an action if the difference between at least one of the calculated values and the corresponding stored value is above a predetermined threshold.

The method according to the invention may therefore be used to detect a drift in the values of resistance, inductance and capacitance of the equivalent model of an apparatus relative to corresponding preceding or theoretical values, making it possible, notably, to anticipate failures of the apparatus, and to carry out repairs or diagnostic operations before or after a failure.

According to one aspect of the invention, the method comprises a step of storing the calculated values of resistance, inductance and capacitance if the difference between at least one of the estimated values and the corresponding stored value is above a predetermined threshold.

A plurality of resistance values, a plurality of inductance values and a plurality of capacitance values may be stored in the storage area. The comparison may also be made with the most recent respective values of resistance, inductance and capacitance stored in the storage area. Additionally, the standard deviation or variance may be calculated over the set of stored values of resistance, inductance and capacitance respectively, so as to detect a drift of these values over time.

Advantageously, the action that is initiated consists in a modification of the pulse width of the voltage control signals, for example if the measured current strength is different from a predetermined value of strength.

According to another aspect of the invention, the action that is initiated consists in an alert enabling the occurrence of a failure to be anticipated, for example if the measured current strength drifts significantly over time relative to a predetermined value of strength.

According to another appearance of the invention, the action that is initiated consists in a failure information message comprising values of resistance, inductance and capacitance stored in the storage area to enable the voltage control of the apparatus to be analyzed when a failure of said apparatus occurs.

The invention also concerns an electronic control unit for controlling the voltage of an electrical apparatus of a motor vehicle, using pulse width modulated signals, said electrical apparatus being capable of being electrically modeled in the form of an equivalent RLC circuit comprising a first branch, comprising a capacitor connected in parallel with a second branch, comprising a resistor and an induction coil connected in series, said electronic control unit comprising:
- a module for controlling the voltage of the apparatus by pulse width modulated signals,
- a storage area capable of storing values of resistance, inductance and capacitance of the equivalent RLC circuit, a module for measuring the voltage at the terminals of the apparatus and the strength of the output current of the apparatus, a module for calculating the values of resistance, inductance and capacitance of the equivalent RLC circuit on the basis of the measured current strength and the measured voltage, and for comparing the calculated values of resistance, inductance and capacitance with the values of resistance, inductance and capacitance, respectively, stored in the storage area, and a module for initiating an action if the difference between at least one of the calculated values and the corresponding stored value is above a predetermined threshold.

According to one aspect of the invention, the electronic control unit is configured for storing the calculated values of resistance, inductance and capacitance in the storage area if the difference between at least one of the estimated values and the corresponding stored value is above a predetermined threshold.

Advantageously, the electronic control unit is configured for storing a plurality of resistance values, a plurality of inductance values and a plurality of capacitance values in the storage area.

Also advantageously, the electronic control unit is configured for comparing the most recent respective values of resistance, inductance and capacitance stored in the storage area.

According to one characteristic of the invention, the electronic control unit is configured for calculating the standard deviation or variance over the set of stored values of resistance, inductance and capacitance respectively, so as to detect a drift of these values over time.

Advantageously, the module for initiating an action is configured for modifying the pulse width of the voltage control signals, for example if the measured current strength is different from a predetermined value of strength.

According to another aspect of the invention, the module for initiating an action is configured for generating an alert which enables the occurrence of a failure to be anticipated, for example if the measured current strength drifts significantly over time relative to a predetermined value of strength.

According to another aspect of the invention, the module for initiating an action is configured for generating a failure information message comprising values of resistance, inductance and capacitance stored in the storage area to enable the voltage control of the apparatus to be analyzed when a failure of said apparatus occurs.

Finally, the invention relates to a motor vehicle comprising at least one apparatus whose voltage can be controlled by pulse width modulated signals, and an electronic control unit such as that described above.

BRIEF DESCRIPTION OF THE DRAWINGS

Other characteristics and advantages of the invention will be apparent from the following description which refers to the attached drawings, provided by way of non-limiting examples, in which identical references are given to similar objects.

DETAILED DESCRIPTION OF THE INVENTION

Figure 1:
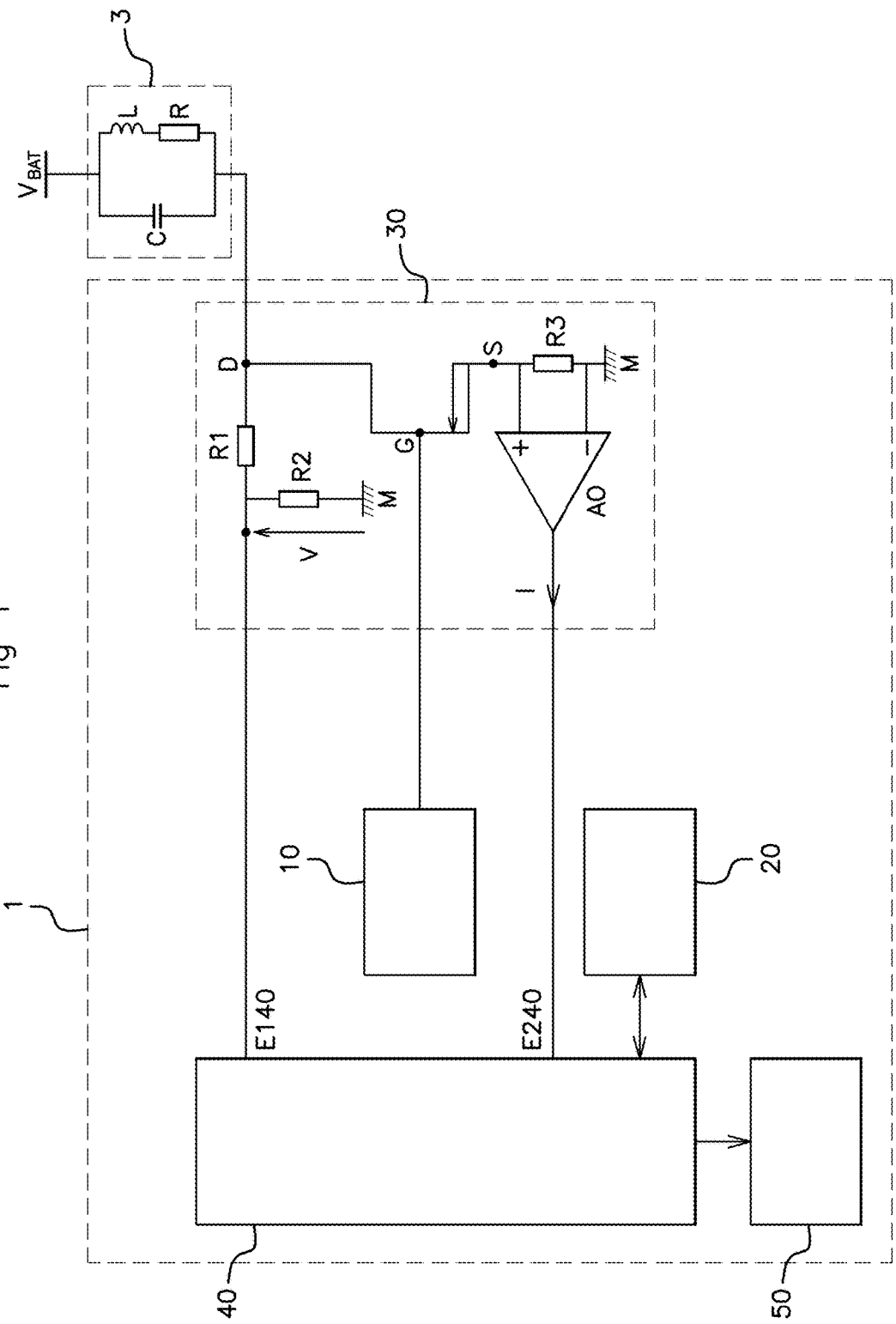
FIG. 1 shows schematically an embodiment of the electronic control unit according to the invention connected to an apparatus for the voltage control of this apparatus.

With reference to FIG. 1, the electronic control unit 1 according to the invention is intended to be fitted in a motor vehicle (not shown) to allow the voltage control, by pulse width modulated signals, of one or more electrical apparatuses 3 of said vehicle.

For the sake of clarity, FIG. 1 shows a single apparatus 3, but it goes without saying that the electronic control unit 1 could provide voltage control for more than one apparatus 3.

This electrical apparatus 3 can be electrically modeled in the form of an equivalent RLC circuit comprising a first branch, comprising a capacitor C connected in parallel with a second branch, comprising a resistor R and an induction coil L, both connected in series.

The apparatus 3 is electrically connected, on the one hand, to the battery $V_{BAT}$ of the vehicle, and, on the other hand, to the electronic control unit 1, at a point denoted by D.

With reference to FIG. 1, the electronic control unit 1 comprises a control module 10, a storage area 20, a measurement module 30, a calculation and comparison module 40, and an initiating module 50.

The control module 10 is configured for controlling the voltage of the apparatus 3 on the basis of pulse width modulated (PWM) signals. This control is provided through a transistor, of the MOSFET-N type in this example, characterized by a drain (point D), a gate (point G) and a source (point S), electrically connected to the apparatus 3, as shown in FIG. 1. It should be noted that any other suitable type of transistor may be used. Since this arrangement of a transistor and a control module 10 and the operation of such a control module 10 are already known, they will not be described further here.

The storage area 20 is capable of storing values of resistance R, coil inductance L and capacitance C of the equivalent RLC circuit modeling the apparatus 3.

Figure 2:
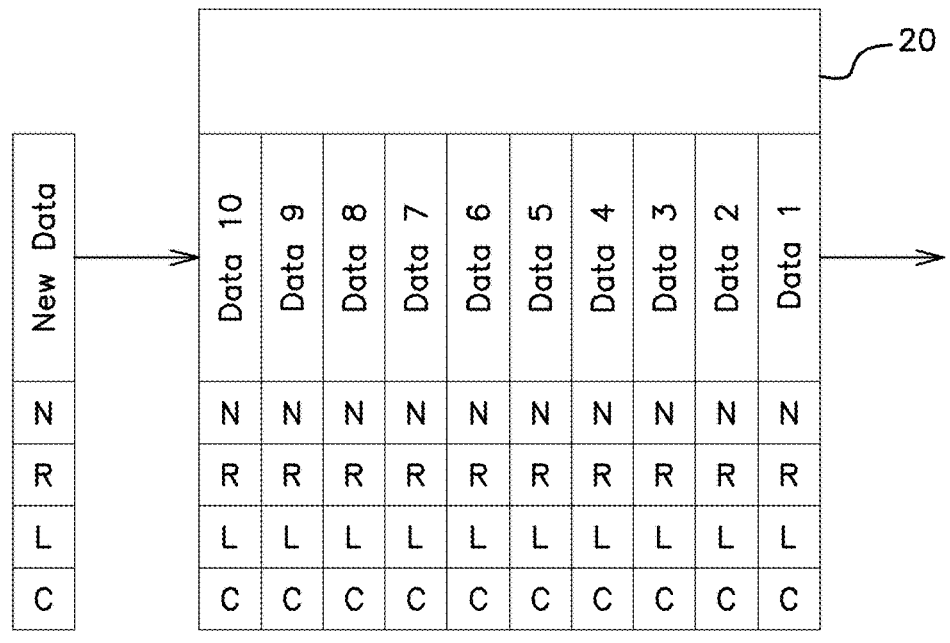
FIG. 2 shows schematically an embodiment of the storage area of the electronic control unit of FIG. 1.
Figure 2:
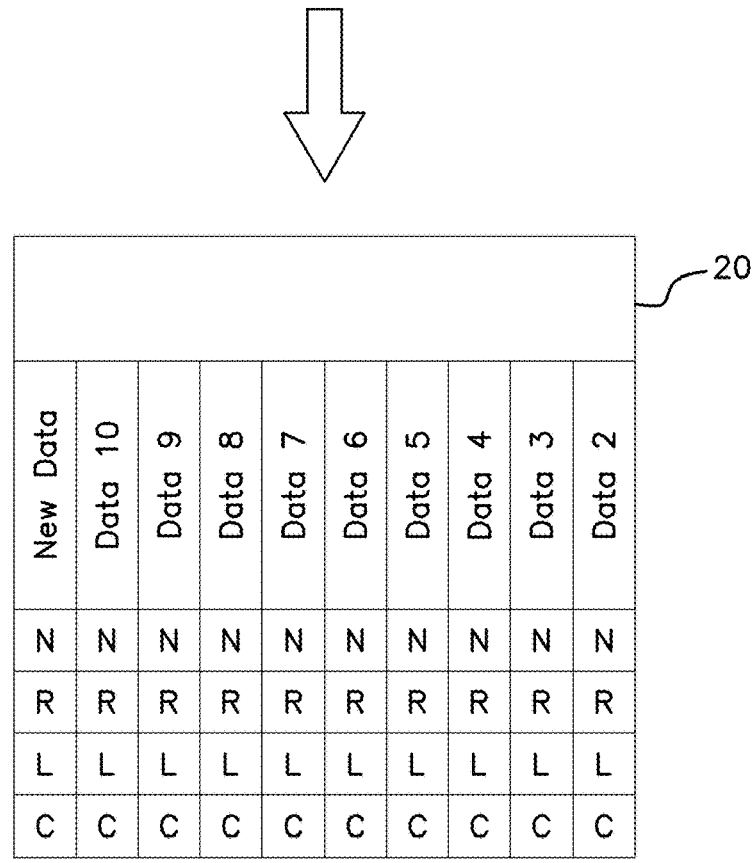

In a preferred embodiment shown in FIG. 2, the storage area 20 is configured for storing values of resistance R, coil inductance L and capacitance C of the equivalent RLC circuit, together with an index N associated with each triplet of values R, L, C, by the known method which is called "first in, first out" (FIFO) in English.

Thus, in the example shown in FIG. 2, ten quadruplets of values N, R, L, C (denoted "Data1" to "Data10" in FIG. 2) are stored at any given instant. When the storage area 20 receives a new quadruplet ("New data") of values R, L, C to be stored, the oldest quadruplet "Data1" of values R, L, C is deleted and replaced by the new triplet "New data" of values R, L, C received. This storage area 20 has the advantage of having an architecture which is simple to manufacture and use, while having a fast response and low cost.

The measurement module 30 is configured for measuring the strength I of the output current of the apparatus 3 and the voltage V at the terminals of the apparatus 3.

For this purpose, the measurement module 30 comprises, in the first place, a first resistor R1 connected, on the one hand, to the point D and, on the other hand, to an input point E140 of the calculation module 40, and a second resistance R2 connected, on the one hand, to the input point E140 and, on the other hand, to the ground M. The voltage V defined between the input point E140 and the ground M is a voltage representative of the voltage at the negative terminal of the apparatus 3, and the positive terminal of the apparatus 3 is connected to the supply battery $V_{BAT}$ of the vehicle. The voltage at the terminals of the apparatus 3 may therefore be found by calculating the difference between the voltage of the supply battery $V_{BAT}$ and the measured voltage V (at the R1/R2 voltage divider bridge).

The measurement module 30 also comprises a third resistor R3, connected on the one hand to the point S and on the other hand to the ground M, and an operational amplifier AO connected by its positive input to the point S and by its negative input to the ground M, and suitable for generating a current I representative of the output current of the apparatus 3.

The calculation module 40 is configured, in the first place, for calculating the values of resistance R, coil inductance L and capacitance C of the equivalent RLC circuit on the basis of the current strength I and the voltage V measured by the measurement module 30.

The calculation module 40 is also configured for comparing the values of resistance, inductance and capacitance calculated by the calculation module 40 with values of resistance R, coil inductance L and capacitance C, respectively, stored in the storage area 20.

The initiating module 50 is configured for initiating an action if the difference between at least one of the calculated values and the corresponding stored value is above a predetermined threshold.

This action may consist in a modification of the pulse width of the PWM voltage control signals, for example if the measured current strength is different from a predetermined value of strength.

This action may also consist in an alert enabling the occurrence of a failure to be anticipated, for example if the measured current strength drifts significantly over time relative to a predetermined value of strength.

This action may also consist in a failure information message comprising values of resistance R, coil inductance L and capacitance C stored in the storage area 20 to enable the voltage control of the apparatus 3 to be analyzed when a failure of said apparatus 3 occurs.

Evidently, the list of the aforementioned actions does not limit the scope of the invention, and any appropriate action would be feasible when the values of resistance R, coil inductance L and capacitance C drift.

Figure 3:
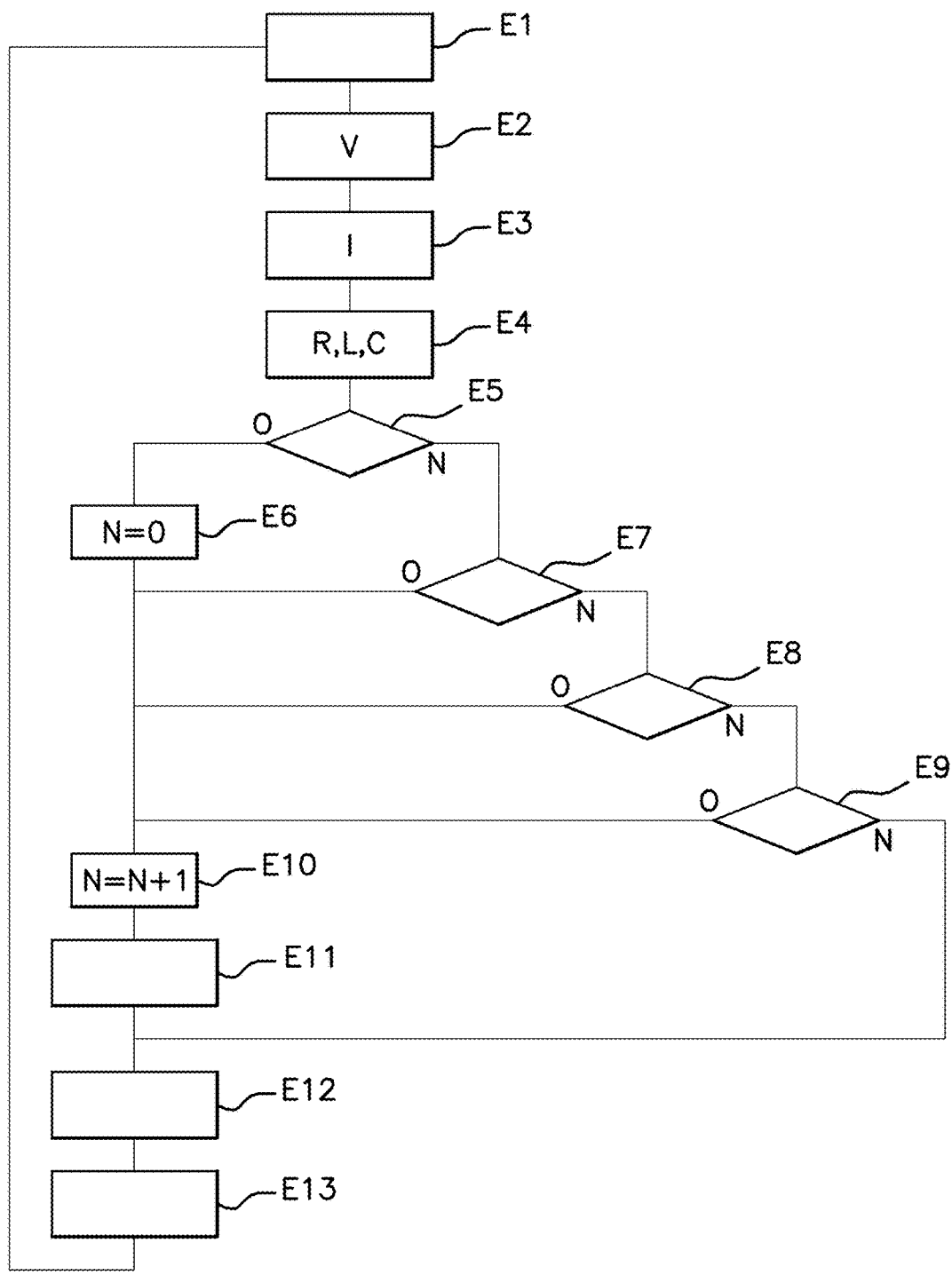
FIG. 3 shows schematically an embodiment of the method according to the invention.

The invention will now be described in its application with reference to FIG. 3.

Initially, when the vehicle engine is started in step E1, the control module 10 controls the voltage of the apparatus on the basis of pulse width modulated (PWM) signals.

The measurement module 30 of the electronic control unit 1 then supplies the voltage V representative of the voltage at the terminals of the apparatus 3 in step E2, and supplies the current strength I of the apparatus 3 in step E3.

The calculation and comparison module 40, which receives this voltage value V on its input E140 and this value of current strength on its input E240, calculates the values of resistance R, coil inductance L and capacitance C of the equivalent RLC circuit to the apparatus 3 in a step E4.

In this non-limiting example, a check is first made (step E5) as to whether the starting of the engine is the first start of the vehicle (or the very first start of the vehicle). If the answer is affirmative, the counter N is set to zero (step E6). If the answer is negative, the calculation and comparison module 40 compares the calculated values of resistance R, coil inductance L and capacitance C with values of the same type stored in the storage area 20, for example all the stored values, or only the last values of R, L and C that have been stored.

Thus, if the difference between the calculated value of resistance R and the stored value or values of resistance R exceeds what is known as the "resistance threshold", by 10% for example, in a step E7, the counter N is incremented by one unit in a step E10, and the values of resistance R, coil inductance L and capacitance C are stored in their turn in the storage area 20, in a step E11.

If the difference between the calculated value of resistance R and the stored value or values of resistance R does not exceeds the resistance threshold, and if the calculated coil inductance value L and the stored value or values of coil inductance L exceeds what is known as the "inductance threshold", by 10% for example, in a step E8, the counter N is then incremented by one unit in a step E10, and the values of resistance R, coil inductance L and capacitance C are stored in their turn in the storage area 20, in a step E11.

If the calculated value of coil inductance L and the stored value or values of coil inductance L do not exceed the inductance threshold, and if the calculated value of capacitance C and the stored value or values of capacitance C exceed what is known as the "capacitance threshold", by 10% for example, in a step E9, the counter N is then incremented by one unit in a step E10, and the values of resistance R, coil inductance L and capacitance C are stored in their turn in the storage area 20, in a step E11.

It should be noted that the counter N may be incremented on each measurement of voltage V and current strength I, but the values of resistance R, coil inductance L and capacitance C cannot be stored unless one of them exceeds the associated drift threshold.

On the basis of the drifts of the values of resistance R, coil inductance L and capacitance C, for example as soon as one or all three of the values of resistance R, coil inductance L and capacitance C exceeds their respective threshold, and on the basis of the drifts of the measured current strength I and/or measured voltage V, the initiating module 50 may initiate an action in a step E12.

This action may consist in a modification of the pulse width of the PWM voltage control signals, for example if the measured current strength is different from a predetermined value of strength. For example, for a measured strength of 2.5 A instead of the expected 3 A, the PWM ratio may, for example, be increased from 50% to 52% to compensate for this.

This action may also consist in an alert enabling the occurrence of a failure to be anticipated, for example if the measured current strength drifts significantly over time relative to a predetermined value of strength. Thus, for example, if the measured current strength I increases in a significant or abnormal manner, an alert message may be generated, leading to the maintenance of the apparatus 3 before a failure of said apparatus 3 occurs.

This action may also consist in a failure information message comprising values of resistance R, coil inductance L and capacitance C stored in the storage area 20 to enable the voltage control of the apparatus 3 to be analyzed when a failure of said apparatus 3 occurs. This is because, if a failure of the apparatus 3 occurs, it may be helpful for the maintenance operator to obtain the values of resistance R, coil inductance L and capacitance C stored in the storage area 20, so that the operator can, notably, determine the nature of the failure and repair it, or possibly improve the apparatus 3.

It should be noted that steps E2 to E11 may be repeated, periodically for example, while the vehicle is being driven, until the engine is stopped in a step E13, before the method is resumed at step E1 when the engine is next started.

It should be noted that this embodiment of the method according to the invention does not limit the scope of the invention, and that, notably, the values of resistance R, coil inductance L and capacitance C calculated by the calculation module 30 could be compared simultaneously in the same step with values of the same type stored in the storage area 20. Similarly, an action may be initiated as soon as one of the values of resistance R, coil inductance L and capacitance C exceeds the associated threshold, or only when each of the three calculated values of resistance R, coil inductance L and capacitance C exceeds the associated threshold.

The invention claimed is:

1. Method for controlling the voltage of an electrical apparatus (3) of a motor vehicle, using pulse width modulated signals, said electrical apparatus (3) being capable of being electrically modeled in the form of an equivalent circuit (RLC) comprising a first branch, comprising a capacitor (C) connected in parallel with a second branch, comprising a resistor (R) and an induction coil (L) connected in series, said method, executed by a control unit of the vehicle, comprising the steps of:
   measuring (E2) the voltage (V) at the terminals of the apparatus and measuring (E3) the strength (I) of the output current of the apparatus (3),
   calculating (E4) the values of resistance (R), coil inductance (L) and capacitance (C) of the equivalent circuit (RLC) on the basis of the measured current strength (I) and the measured voltage (V),
   comparing (E7, E8, E9) the calculated values of resistance (R), inductance (L) and capacitance (C) with values of resistance (R), inductance (L) and capacitance (C), respectively, stored in a storage area (20) of the electronic control unit (1), and
   initiating (E12) an action if the difference between at least one of the calculated values and the corresponding stored value is above a predetermined threshold.

2. Method according to claim 1, comprising a step (E11) of storing the calculated values of resistance (R), inductance (L) and capacitance (C) if the difference between at least one of the estimated values and the corresponding stored value is above a predetermined threshold.

3. Method according to claim 1, wherein a plurality of values of resistance (R), a plurality of values of inductance (L) and a plurality of values of capacitance (C) being stored in the storage area (20), the standard deviation or the variance are calculated over the set of stored values of resistance (R), inductance (I) and capacitance (C) respectively, so as to detect a drift of these values over time.

4. Method according to claim 1, wherein the action that is initiated consists in a modification of the pulse width of the voltage control signals, for example if the measured current strength (I) is different from a predetermined value of strength.

5. Method according to claim 1, wherein the action that is initiated consists in an alert enabling the occurrence of a failure to be anticipated, for example if the measured current strength (I) drifts significantly over time relative to a predetermined value of strength.

6. Method according to claim 1, wherein the action that is initiated consists in a failure information message comprising values of resistance (R), inductance (L) and capacitance (C) stored in the storage area (20) to enable the voltage control of the electrical apparatus (3) to be analyzed when a failure of said apparatus (3) occurs.

7. Electronic control unit (1) for controlling the voltage of an electrical apparatus (3) of a motor vehicle, using pulse width modulated signals, said electrical apparatus (3) being capable of being electrically modeled in the form of an equivalent circuit (RLC) comprising a first branch, comprising a capacitor (C) connected in parallel with a second branch, comprising a resistor (R) and an induction coil (L) connected in series, said electronic control unit (1) comprising:
   a module (10) for controlling the voltage of the electrical apparatus (3) by pulse width modulated signals,
   a storage area (20) capable of storing values of resistance (R), coil inductance (L) and capacitance (C) of the equivalent circuit (RLC),
   a module (30) for measuring the voltage at the terminals of the electrical apparatus (3) and the strength of the output current of the electrical apparatus (3), and
   a module (40) for calculating the values of resistance (R), inductance (L) and capacitance (C) of the equivalent circuit (RLC) on the basis of the measured current strength (I) and the measured voltage (V), and for comparing the calculated values of resistance (R), inductance (L) and capacitance (C) with the values of resistance (R), inductance (L) and capacitance (C), respectively, stored in the storage area (20), and
   a module (50) for initiating an action if the difference between at least one of the calculated values and the corresponding stored value is above a predetermined threshold.

8. Electronic control unit (1) according to claim 7, configured to store calculated values of resistance (R), inductance (L) and capacitance (C) in the storage area (20) if the difference between at least one of the estimated values and the corresponding stored value is above a predetermined threshold.

9. Electronic control unit (1) according to claim 7, wherein, a plurality of values of resistance (R), a plurality of values of inductance (L) and a plurality of values of capacitance (C) being stored in the storage area (20), the electronic control unit (1) is configured to calculate the standard deviation or the variance over the set of stored values of resistance (R), inductance (I) and capacitance (C), respectively, so as to detect a drift of these values over time.

10. Motor vehicle comprising at least one electrical apparatus (3) whose voltage can be controlled by pulse width modulated signals, and an electronic control unit (1) according to claim 7.

11. Method according to claim 2, wherein a plurality of values of resistance (R), a plurality of values of inductance (L) and a plurality of values of capacitance (C) being stored in the storage area (20) , the standard deviation or the variance are calculated over the set of stored values of resistance (R), inductance (I) and capacitance (C) respectively, so as to detect a drift of these values over time.

12. Method according to claim 2, wherein the action that is initiated consists in a modification of the pulse width of the voltage control signals, for example if the measured current strength (I) is different from a predetermined value of strength.

13. Method according to claim 3, wherein the action that is initiated consists in a modification of the pulse width of the voltage control signals, for example if the measured current strength (I) is different from a predetermined value of strength.

14. Method according to claim 2, wherein the action that is initiated consists in an alert enabling the occurrence of a failure to be anticipated, for example if the measured current strength (I) drifts significantly over time relative to a predetermined value of strength.

15. Method according to claim 3, wherein the action that is initiated consists in an alert enabling the occurrence of a failure to be anticipated, for example if the measured current strength (I) drifts significantly over time relative to a predetermined value of strength.

16. Method according to claim 4, wherein the action that is initiated consists in an alert enabling the occurrence of a failure to be anticipated, for example if the measured current strength (I) drifts significantly over time relative to a predetermined value of strength.

17. Method according to claim 2, wherein the action that is initiated consists in a failure information message comprising values of resistance (R), inductance (L) and capacitance (C) stored in the storage area (20) to enable the voltage control of the electrical apparatus (3) to be analyzed when a failure of said apparatus (3) occurs.

18. Method according to claim 3, wherein the action that is initiated consists in a failure information message comprising values of resistance (R), inductance (L) and capacitance (C) stored in the storage area (20) to enable the voltage control of the electrical apparatus (3) to be analyzed when a failure of said apparatus (3) occurs.

19. Method according to claim 4, wherein the action that is initiated consists in a failure information message comprising values of resistance (R), inductance (L) and capacitance (C) stored in the storage area (20) to enable the voltage control of the electrical apparatus (3) to be analyzed when a failure of said apparatus (3) occurs.

20. Method according to claim 5, wherein the action that is initiated consists in a failure information message comprising values of resistance (R), inductance (L) and capacitance (C) stored in the storage area (20) to enable the voltage control of the electrical apparatus (3) to be analyzed when a failure of said apparatus (3) occurs.

\* \* \* \* \*